United States Patent
Huang et al.

(10) Patent No.: US 8,895,367 B2
(45) Date of Patent: Nov. 25, 2014

(54) FABRICATION METHOD OF SEMICONDUCTOR PACKAGE

(71) Applicant: Siliconware Precision Industries Co., Ltd., Taichung (TW)

(72) Inventors: Jung-Pang Huang, Taichung (TW); Hui-Min Huang, Taichung (TW); Kuan-Wei Chuang, Taichung (TW); Chun-Tang Lin, Taichung (TW); Yih-Jenn Jiang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/964,465

(22) Filed: Aug. 12, 2013

(65) Prior Publication Data

US 2013/0330883 A1 Dec. 12, 2013

Related U.S. Application Data

(62) Division of application No. 13/112,226, filed on May 20, 2011, now Pat. No. 8,519,526.

(30) Foreign Application Priority Data

Dec. 22, 2010 (TW) ............... 99145148 A

(51) Int. Cl.
*H01L 21/56* (2006.01)
*H01L 23/00* (2006.01)
*H01L 23/36* (2006.01)
*H01L 23/538* (2006.01)
*H01L 23/31* (2006.01)

(52) U.S. Cl.
CPC ......... *H01L 21/56* (2013.01); *H01L 2924/3511* (2013.01); *H01L 2924/014* (2013.01); *H01L 24/19* (2013.01); *H01L 23/36* (2013.01); *H01L 24/20* (2013.01); *H01L 23/3121* (2013.01); *H01L 2224/04105* (2013.01); *H01L 21/568* (2013.01); *H01L 2224/20* (2013.01); *H01L 23/5389* (2013.01); *H01L 24/96* (2013.01)
USPC ........... 438/124; 438/127; 438/108; 438/112; 257/692; 257/668; 257/E21.511

(58) Field of Classification Search
CPC ... H01L 21/558; H01L 23/36; H01L 23/5389; H01L 24/96; H01L 21/56; H01L 24/19; H01L 24/20; H01L 23/3121; H01L 2224/20; H01L 2924/014
USPC .......... 438/124, 127, 108, 112; 257/692, 668, 257/E21.511
See application file for complete search history.

(56) References Cited

U.S. PATENT DOCUMENTS

| 3,093,882 A | 6/1963 | Emeis |
| 5,250,843 A | 10/1993 | Eichelberger |

(Continued)

*Primary Examiner* — Thinh T Nguyen
(74) *Attorney, Agent, or Firm* — Edwards Wildman Palmer LLP; Peter F. Corless; Steven M. Jensen

(57) ABSTRACT

A semiconductor package includes: a chip having an active surface with a plurality of electrode pads and an inactive surface opposite to the active surface; an encapsulant encapsulating the chip and having opposite first and second surfaces, the first surface being flush with the active surface of the chip; and first and second metal layers formed on the second surface of the encapsulant, thereby providing a rigid support to the overall structure to prevent warpage and facilitating heat dissipation of the overall structure.

10 Claims, 4 Drawing Sheets

(56) References Cited

U.S. PATENT DOCUMENTS

| | | | |
|---|---|---|---|
| 5,607,883 A | 3/1997 | Bhattacharyya et al. | |
| 6,423,570 B1 * | 7/2002 | Ma et al. | 438/106 |
| 7,202,107 B2 | 4/2007 | Fuergut et al. | |
| 7,435,910 B2 | 10/2008 | Sakamoto et al. | |
| 8,242,383 B2 * | 8/2012 | Zeng | 174/262 |
| 2006/0087037 A1 | 4/2006 | Hsu | |
| 2008/0176035 A1 * | 7/2008 | Shih et al. | 428/131 |
| 2010/0053920 A1 * | 3/2010 | Zeng | 361/764 |

* cited by examiner

FABRICATION METHOD OF SEMICONDUCTOR PACKAGE

CROSS-REFERENCE TO RELATED APPLICATIONS

This application is a divisional of application U.S. Ser. No. 13/112,226, filed on May 20, 2011, issued as U.S. Pat. No. 8,519,526 on Aug. 27, 2013, which claims under 35 U.S.C. §119(a) the benefit of Taiwanese Application No. 099145148, filed Dec. 22, 2010, the entire contents of which are incorporated herein by reference.

BACKGROUND OF THE INVENTION

1. Field of the Invention

The present invention relates to a semiconductor package and a fabrication method thereof.

2. Description of Related Art

In recent years, chip scale packages (CSPs) have been developed to meet the demand for lighter, thinner and smaller semiconductor packages. Such a chip scale package has a size the same as or slightly larger than that of a chip. FIGS. 1A to 1D are cross-sectional views showing a fabrication method of a conventional chip scale package as disclosed by U.S. Pat. No. 7,202,107.

Referring to FIG. 1A, a carrier board 10 having a heat-sensitive adhesive layer 100 is provided. A plurality of chips 11 each having an active surface 11a with a plurality of electrode pads 110 and an inactive surface 11b opposite to the active surface 11a is disposed on the carrier board 10 and attached to the adhesive layer 100 through the active surfaces 11a thereof.

Referring to FIG. 1B, an encapsulant 12 is formed on the adhesive layer 100 to encapsulate the chips 11, wherein the encapsulant 12 has a first surface 12a attached to the adhesive layer 100 and an exposed second surface 12b.

Referring to FIG. 1C, the chips 11 and the encapsulant 12 are heated so as to be completely separated from the heat-sensitive adhesive layer 100, thereby exposing the active surfaces 11a of the chips 11 and the first surface 12a of the encapsulant 12.

Referring to FIG. 1D, a wiring layer 13 is formed on the active surfaces 11a of the chips 11 and the first surface 12a of the encapsulant 12, and then a singulation process is performed along predefined cutting lines L to obtain a plurality of chip scale packages without substrates.

However, in the fabrication process of FIG. 1C, after the chips 11 and the encapsulant 12 are completely separated from the adhesive layer 100, the overall package structure loses the rigid support of the carrier board 10 such that warpage can easily occur to the backside of the overall package structure (as shown by the dashed lines in FIG. 1C), and, even worse, cracking of the chips 11 may occur.

Further, if a wiring process is performed to the backside of the package, warpage can occur on the front side of the structure. The above-described front and back warpage effects cannot completely offset each another, thus reducing the reliability of subsequent processes and reducing the product yield.

Therefore, there is a need to provide a semiconductor package and a fabrication method thereof so as to overcome the above-described drawbacks.

SUMMARY OF THE INVENTION

Accordingly, the present invention provides a semiconductor package, which comprises: a chip having an active surface with a plurality of electrode pads and an inactive surface opposite to the active surface; an encapsulant encapsulating the chip, wherein the encapsulant has a first surface and a second surface opposite to the first surface, the active surface of the chip being flush with the first surface and exposed from the first surface; and the first and second metal layers formed on the second surface of the encapsulant.

The present invention further provides a fabrication method of a semiconductor package, which comprises the steps of: providing a carrier board; disposing a plurality of chips on the carrier board, wherein each of the chips has an active surface with a plurality of electrode pads and an inactive surface opposite to the active surface, the active surface being attached to the carrier board; forming on the carrier board an encapsulant to encapsulate the chips, wherein the encapsulant has a first surface attached to the carrier board and a second surface opposite to the first surface; removing the carrier board to expose the active surfaces of the chips and the first surface of the encapsulant; and forming first and second metal layers on the second surface of the encapsulant.

In the above-described method, the carrier board can be a wafer.

In the above-described method, the active surface of each of the chips can be attached to the carrier board through an adhesive layer.

In the above-described semiconductor package and fabrication method thereof, the inactive surface of the chip is flush with the second surface of the encapsulant and exposed from the second surface of the encapsulant, and the first and second metal layer are further formed on the inactive surface of the chip.

In the above-described semiconductor package and fabrication method thereof, the first metal layer is formed by electroless plating or sputtering, and the second metal layer is formed by electroplating.

The above-described semiconductor package and fabrication method thereof further comprise the step of forming a built-up structure on the active surface of the chip and the first surface of the encapsulant, wherein the built-up structure comprises at least a dielectric layer, a wiring layer formed on the dielectric layer, and a plurality of conductive vias formed in the dielectric layer and electrically connecting the wiring layer and the electrode pads. Further, an insulating protection layer is formed on the built-up structure, the insulating protection layer having a plurality of openings for exposing portions of the outermost wiring layer of the built-up structure.

Therefore, the first and second metal layers formed on the second surface of the encapsulant provide a rigid support to the overall package structure so as to avoid warpage of the overall package structure. Compared with the conventional structure that lacks a rigid support, the present invention avoids warpage of the backside of the overall package structure.

Further, during the fabrication process of the built-up structure, the present invention avoids warpage of the front side of the overall package structure due to the support of the first and second metal layers, thereby effectively improving the reliability of subsequent processes, avoiding the risk of cracking of the chips and improving the product yield. Moreover, the first and second metal layers facilitate heat dissipation of the overall package structure.

BRIEF DESCRIPTION OF DRAWINGS

FIGS. 2E' to 2G' are cross-sectional views showing a fabrication method of a semiconductor package according to another embodiment of the present invention.

DETAILED DESCRIPTION OF PREFERRED EMBODIMENTS

The following illustrative embodiments are provided to illustrate the disclosure of the present invention along with its advantages, these and other advantages and effects being apparent to those in the art after reading this specification.

It should be noted that the drawings are not intended to limit the present invention. Various modification and variations can be made without departing from the spirit of the present invention. Further, terms such as "one", "above", etc. are merely for illustrative purpose and should not be construed to limit the scope of the present invention.

FIGS. 2A to 2G show a fabrication method of a semiconductor package according to an embodiment of the present invention.

Figure 1A:
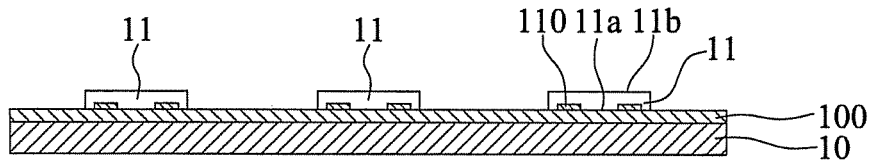
FIGS. 1A to 1D are cross-sectional views of a conventional semiconductor package.
Figure 1B:
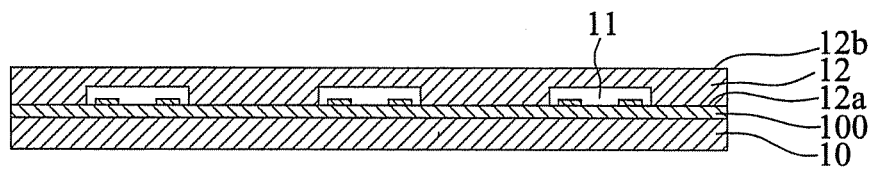
Figure 1C:
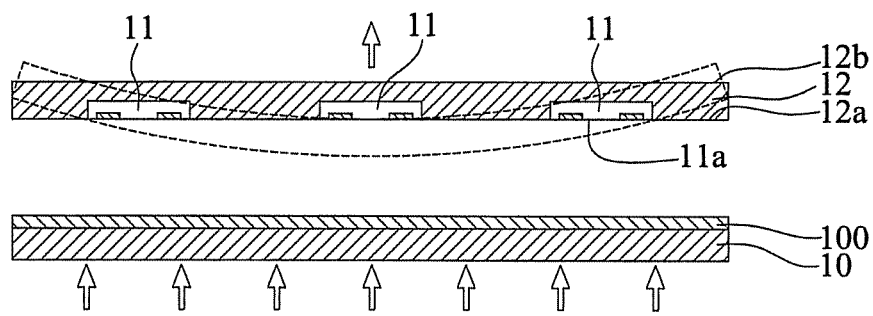
Figure 1D:
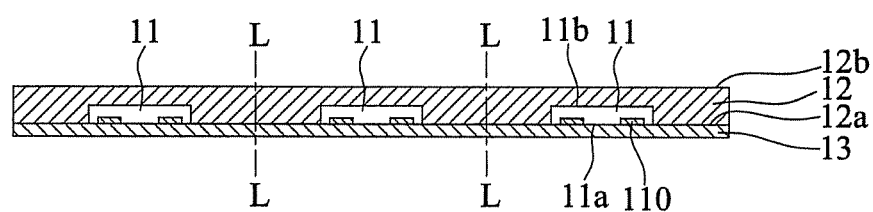
Figure 2A:
FIGS. 2A to 2G are cross-sectional views showing a fabrication method of a semiconductor package according to an embodiment of the present invention.

Referring to FIG. 2A, a carrier board 20 having an adhesive layer 200 is provided. In the present embodiment, the carrier board 20 is a wafer.

Figure 2B:
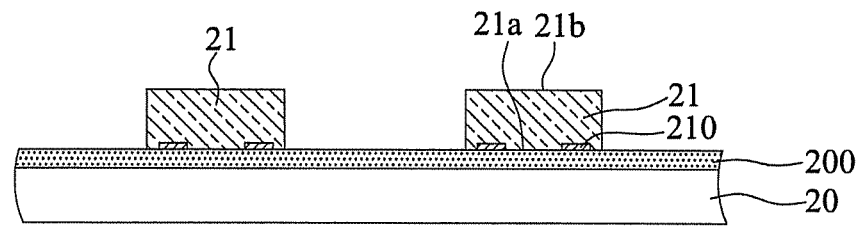

Referring to FIG. 2B, a plurality of chips 21 each having an active surface 21a with a plurality of electrode pads 210 and an inactive surface 21b opposite to the active surface 21a is disposed on the carrier board 20, the active surfaces 21a of the chips 21 being attached to the adhesive layer 200 of the carrier board 20.

Figure 2C:
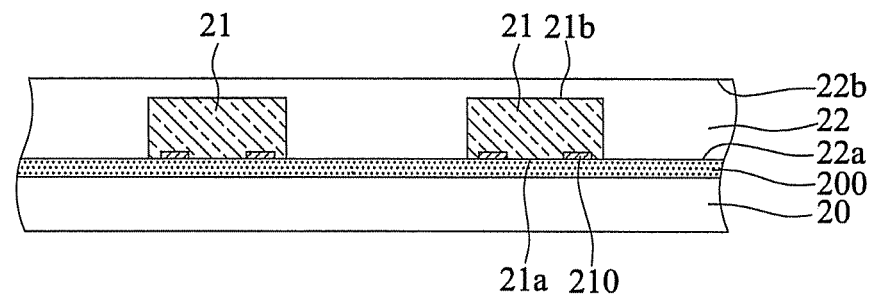

Referring to FIG. 2C, an encapsulant 22 is formed on the adhesive layer 200 of the carrier board 20 so as to encapsulate the chips 21, wherein the encapsulant 22 has a first surface 22a attached to the adhesive layer 200 and an exposed second surface 22b opposite to the first surface 22a.

Figure 2D:
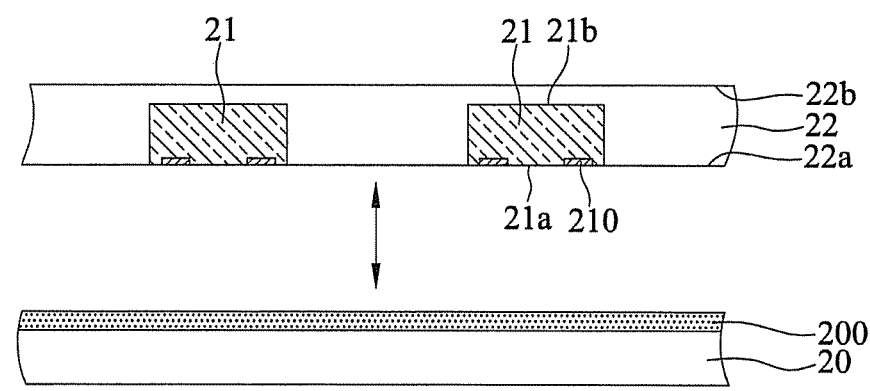

Referring to FIG. 2D, the carrier board 20 and the adhesive layer 200 are removed to expose the active surfaces 21a of the chips 21 and the first surface 22a of the encapsulant 22.

Figure 2E:
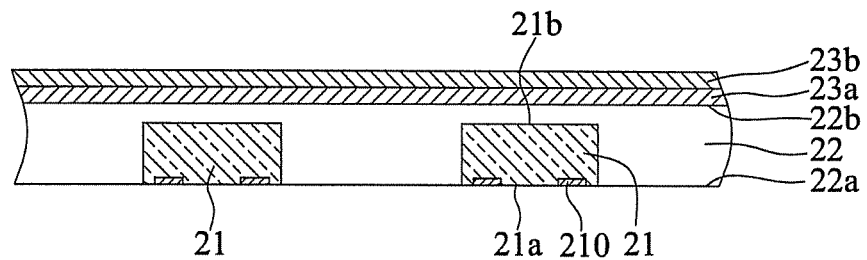

Referring to FIG. 2E, a first metal layer 23a is formed on the second surface 22b of the encapsulant 22 by electroless plating or sputtering, and then a second metal layer 23b is formed on the first metal layer 23a by electroplating, wherein the first and second metal layers 23a, 23b are spaced from the inactive surfaces 21b of the chips 21. In the present embodiment, the first and second metal layers 23a, 23b can be made of the same material or different materials.

Figure 2F:
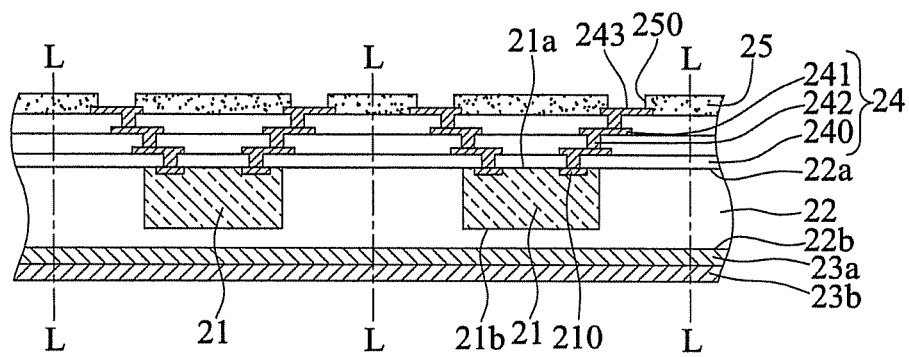

Referring to FIG. 2F, a built-up structure 24 is formed on the active surfaces 21a of the chips 21 and the first surface 22a of the encapsulant 22. The built-up structure 24 comprises at least a dielectric layer 240, a wiring layer 241 formed on the dielectric layer 240, and a plurality of conductive vias 242 formed in the dielectric layer 240 and electrically connecting the wiring layer 241 and the electrode pads 210. Further, an insulating protection layer 25 is formed on the outermost wiring layer 241 and has a plurality of openings 250 through which portions of the outermost wiring layer 241 are exposed to serve as conductive pads 243 for mounting conductive elements made of, for example, solder material, wherein the insulating protection layer 25 is a solder mask layer.

Figure 2G:
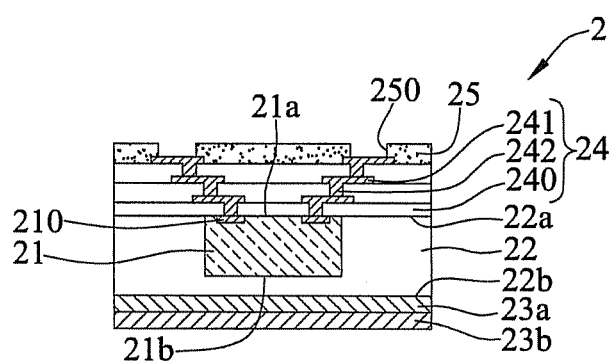
Figure 2E:
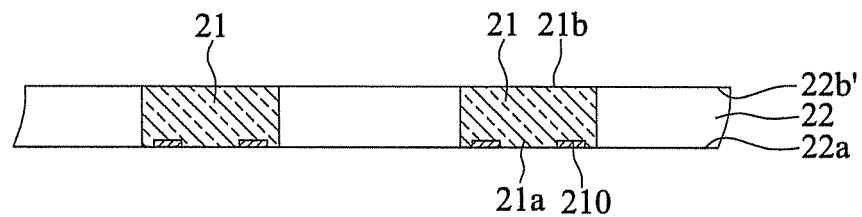
Figure 2F:
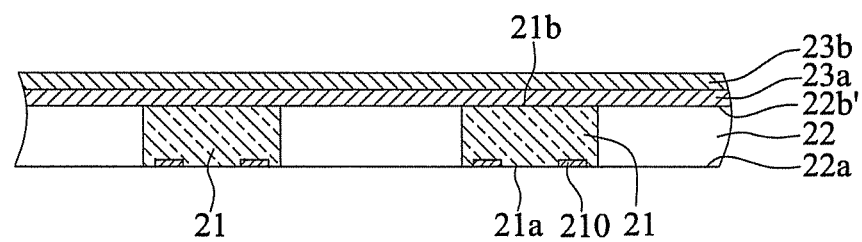
Figure 2G:
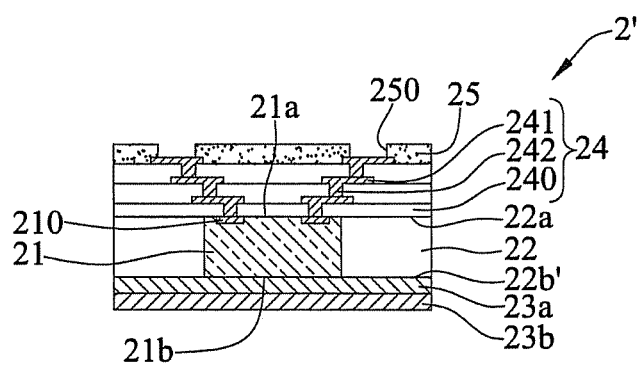

Referring to FIG. 2G a singulation process is performed along predefined cutting lines L (as shown in FIG. 2F) to obtain a plurality of chip scale packages 2.

FIGS. 2E' to 2G' show a fabrication method of a semiconductor package according to another embodiment of the present invention.

Referring to FIG. 2E', continued from FIG. 2D, after the carrier board 20 and the adhesive layer 200 are removed, the encapsulant 22 is ground to provide a second surface 22b' which is flush with the inactive surfaces 21b of the chips 21.

Referring to FIG. 2F', a first metal layer 23a is formed on the second surface 22b' of the encapsulant 22 and the inactive surfaces 21b of the chips 21 by electroless plating or sputtering, and then a second metal layer 23b is formed on the first metal layer 23a by electroplating.

Referring to FIG. 2G', a built-up structure 24 is formed on the active surfaces 21a of the chips 21 and the first surface 22a of the encapsulant 22, and then a singulation process is performed to obtain a plurality of semiconductor packages 2'.

The present invention forms a first metal layer 23a and a second metal layer 23b on the second surface 22b or 22b' of the encapsulant 22 to provide a rigid support to the overall package structure. Compared with the conventional structure that lacks a rigid support, the present invention avoids warpage of the backside of the overall package structure.

Further, during the fabrication process of the built-up structure 24, the present invention avoids warpage of the front side of the overall package structure due to the support of the first and second metal layers 23a, 23b, thereby effectively improving the reliability of subsequent processes, avoiding the risk of cracking of the chips 21 and improving the product yield.

Further, the first and second metal layers 23a, 23b provide a heat dissipating function so as to facilitate heat dissipation of the chips 21.

The present invention further provides a semiconductor package 2, which comprises: a chip 21 having an active surface 21a with a plurality of electrode pads 210 and an inactive surface 21b opposite to the active surface 21a; an encapsulant 22 encapsulating the chip 21, wherein the encapsulant 22 has a first surface 22a and a second surface 22b opposite to the first surface 22a, the active surface 21a of the chip 21 being flush with the first surface 22a of the encapsulant 22 and exposed from the first surface 22a of the encapsulant 22; and first and second metal layers 23a, 23b formed on the second surface of the encapsulant 22. Therein, the first metal layer 23a is a layer of electroless plated or sputtered metal material, and the second metal layer 23b is a layer of electroplated metal material.

The semiconductor package 2 further comprises a built-up structure 24 formed on the active surface 21a of the chip 21 and the first surface 22a of the encapsulant 22. The built-up structure 24 comprises at least a dielectric layer 240, a wiring layer 241 formed on the dielectric layer 240, and a plurality of conductive vias 242 formed in the dielectric layer 240 and electrically connecting the wiring layer 241 and the electrode pads 210. Further, an insulating protection layer 25 is formed on the built-up structure 24 and has a plurality of openings 250 for exposing portions of the outermost wiring layer 241.

In another embodiment, the present invention provides a package 2', wherein the inactive surface 21b of the chip 21 is flush with the second surface 22b' of the encapsulant 22 so as to be exposed from the second surface 22b' of the encapsulant 22, and the first metal layer 23a and the second metal layer 23b are further formed on the inactive surface 21b of the chip 21.

According to the present invention, the first and second metal layers formed on the second surface of the encapsulant provide a rigid support to the overall package structure so as to avoid warpage of the overall package structure, thereby effectively increasing the reliability of subsequent processes, significantly decreasing the risk of cracking of the chip and improving the product yield.

Further, the first and second metal layer provide a heat dissipating function so as to facilitate heat dissipation of the chip.

The above-described descriptions of the detailed embodiments are provided to illustrate the preferred implementation according to the present invention and are not intended to limit the scope of the present invention. Accordingly, many modifications and variations completed by those with ordinary skill in the art will fall within the scope of present invention defined by the appended claims.

What is claimed is:

1. A fabrication method of a semiconductor package, comprising the steps of:
   providing a carrier board;
   disposing a plurality of chips on the carrier board, wherein each of the chips has an active surface with a plurality of electrode pads and an inactive surface opposite to the active surface, the active surface being attached to the carrier board;
   forming on the carrier board an encapsulant to encapsulate the chips, wherein the encapsulant has a first surface attached to the carrier board and a second surface opposite to the first surface;
   removing the carrier board to expose the active surfaces of the chips and the first surface of the encapsulant;
   forming first and second metal layers on all of the second surface of the encapsulant; and
   after forming the first and second metal layers, performing a singulation process.

2. The method of claim 1, wherein the carrier board is a wafer.

3. The method of claim 1, wherein the active surface of each of the chips is attached to the carrier board through an adhesive layer.

4. The method of claim 1, further comprising, before the step of forming the first and second metal layers, the step of grinding the encapsulant such that the second surface of the encapsulant is flush with the inactive surfaces of the chips.

5. The method of claim 4, wherein the first and second metal layers are further formed on the inactive surfaces of the chips.

6. The method of claim 1, further comprising, after the step of forming the first and second metal layers, the step of forming a built-up structure on the active surfaces of the chips and the first surface of the encapsulant.

7. The method of claim 6, wherein the built-up structure comprises at least a dielectric layer, a wiring layer formed on the dielectric layer, and a plurality of conductive vias formed in the dielectric layer and electrically connecting the wiring layer and the electrode pads.

8. The method of claim 7, further comprising the step of forming an insulating protection layer on the built-up structure, the insulating protection layer having a plurality of openings for exposing portions of the outermost wiring layer of the built-up structure.

9. The method of claim 6, wherein the singulation process is performed after the step of forming the built-up structure.

10. The method of claim 1, wherein the first metal layer is formed by electroless plating or sputtering, and the second metal layer is formed by electroplating.

* * * * *